US 11,908,880 B2

(12) United States Patent
Takagi et al.

(10) Patent No.: US 11,908,880 B2
(45) Date of Patent: Feb. 20, 2024

(54) SOLID STATE IMAGING DEVICE

(71) Applicant: HAMAMATSU PHOTONICS K.K., Hamamatsu (JP)

(72) Inventors: Shin-ichiro Takagi, Hamamatsu (JP); Yasuhito Yoneta, Hamamatsu (JP); Masaharu Muramatsu, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 342 days.

(21) Appl. No.: 17/344,228

(22) Filed: Jun. 10, 2021

(65) Prior Publication Data

US 2021/0305312 A1    Sep. 30, 2021

Related U.S. Application Data

(63) Continuation of application No. 16/643,102, filed as application No. PCT/JP2018/027114 on Jul. 19, 2018, now Pat. No. 11,127,777.

(30) Foreign Application Priority Data

Sep. 4, 2017 (JP) ................................ 2017-169469

(51) Int. Cl.
*H01L 27/148* (2006.01)
*H04N 25/711* (2023.01)
*H04N 25/73* (2023.01)

(52) U.S. Cl.
CPC ..... *H01L 27/14843* (2013.01); *H04N 25/711* (2023.01); *H04N 25/73* (2023.01)

(58) Field of Classification Search
CPC ......... H01L 27/14843; H01L 27/14603; H01L 27/14607; H01L 27/14812;

(Continued)

(56) References Cited

U.S. PATENT DOCUMENTS 6,985,182 B1    1/2006 Morinaka et al.
11,127,777 B2 *  9/2021 Takagi .............. H01L 27/14843
(Continued)

FOREIGN PATENT DOCUMENTS

CN    1402355 A    3/2003
CN    1989764 A    6/2007
(Continued)

OTHER PUBLICATIONS

International Preliminary Report on Patentability dated Mar. 19, 2020 for PCT/JP2018/027114.

*Primary Examiner* — Shahed Ahmed
*Assistant Examiner* — Sun Mi Kim King
(74) *Attorney, Agent, or Firm* — Faegre Drinker Biddle & Reath LLP

(57) ABSTRACT

A first region includes a plurality of first transfer column regions distributed in a first direction. A second region includes a plurality of second transfer column regions distributed in the first direction. The second region is positioned downstream of the first region in a charge transfer direction in the second transfer section. Lengths in a second direction of the plurality of first transfer column regions are equal. Lengths in the second direction of the plurality of second transfer column regions are longer than the length of the first transfer column region, and increase as the second transfer column region is positioned downstream in the charge transfer direction. A third region is disposed to correspond to the first region and extends along the first direction. A fourth region is disposed to correspond to the second region and extends such that an interval between the fourth region and a pixel region in the second direction increases in the charge transfer direction in response to a change in the lengths of the plurality of second transfer column regions.

6 Claims, 13 Drawing Sheets

(58) Field of Classification Search
CPC ......... H01L 27/14831; H01L 27/14605; H01L 27/14806; H04N 25/71; H04N 25/73; H04N 25/711
See application file for complete search history.

(56) References Cited

U.S. PATENT DOCUMENTS

| | | |
|---|---|---|
| 2008/0284893 A1 | 11/2008 | Obara |
| 2009/0073296 A1 | 3/2009 | Koshiba |
| 2011/0187908 A1* | 8/2011 | Kawahito ......... H01L 27/14641 250/214 R |
| 2011/0261240 A1 | 10/2011 | Nohara et al. |
| 2013/0043373 A1 | 2/2013 | Asano et al. |
| 2016/0268334 A1 | 9/2016 | Takagi et al. |

FOREIGN PATENT DOCUMENTS

| | | |
|---|---|---|
| CN | 105684150 A | 6/2016 |
| CN | 106664383 A | 5/2017 |
| EP | 0383519 A2 | 8/1990 |
| JE | 2012-004755 A | 1/2012 |
| JP | 2000-350100 A | 12/2000 |
| JP | 2001-119010 A | 4/2001 |
| JP | 2003-046867 A | 2/2003 |
| JP | 2010-130233 A | 6/2010 |
| KR | 1020170049522 | 5/2017 |
| WO | WO 2016/035494 A1 | 3/2016 |

\* cited by examiner

FIG. 4A
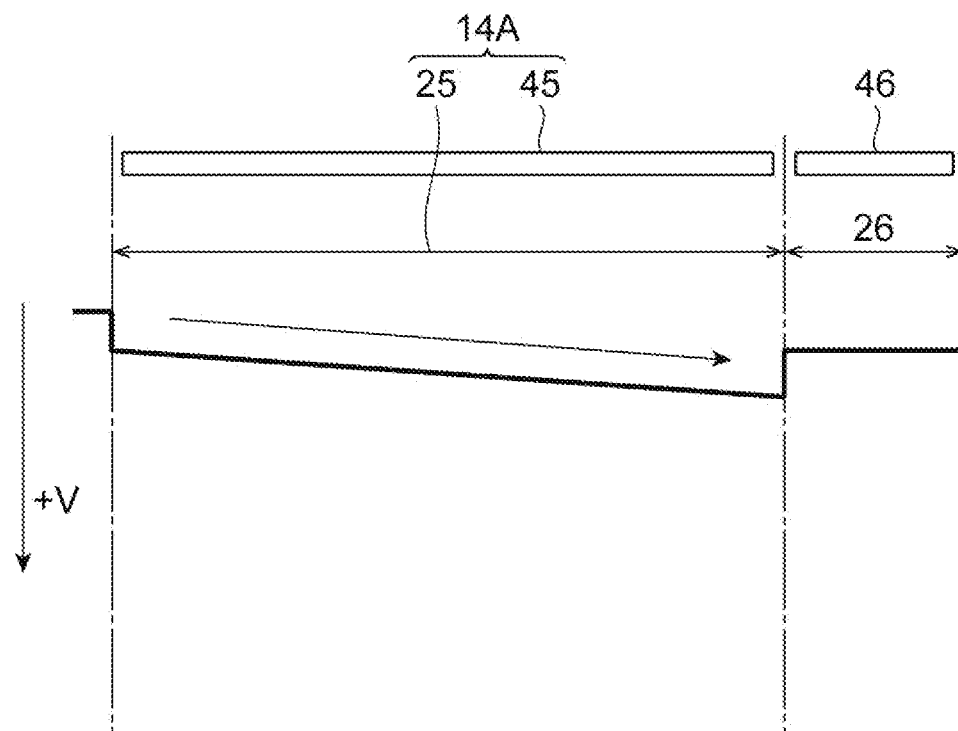
FIG. 4B
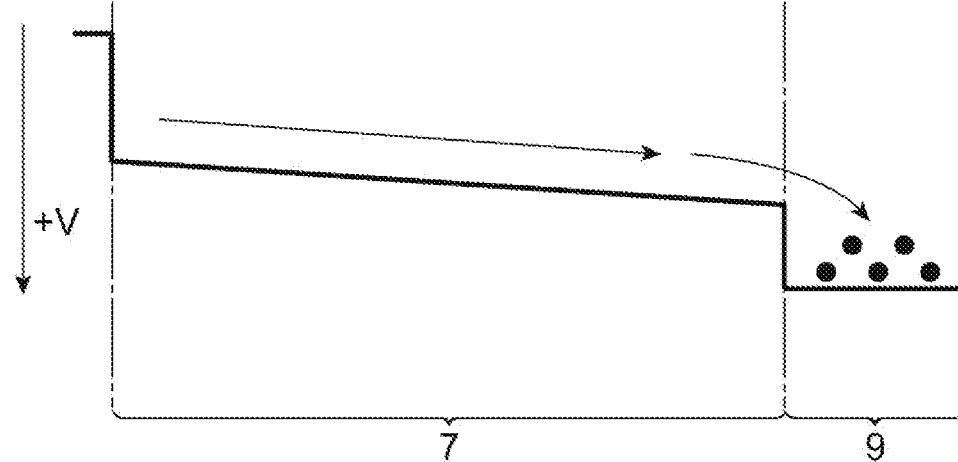
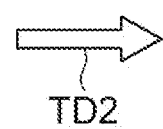

*Fig.7*

| WIDTH | VALUE ($\mu m$) |
|---|---|
| $W_0$ | 0.8 |
| $W_1$ | 0.9 |
| $W_2$ | 1.0 |
| $W_3$ | 1.1 |
| $W_4$ | 1.2 |
| $W_5$ | 1.3 |
| $W_6$ | 1.5 |
| $W_7$ | 1.8 |
| $W_8$ | 2.0 |
| $W_9$ | 2.4 |
| $W_{10}$ | 2.6 |
| $W_{11}$ | 3.5 |
| $W_{12}$ | 6.1 |

SOLID STATE IMAGING DEVICE

This is a continuation application of copending application Ser. No. 16/643,102 filed Feb. 28, 2020, which is the National Stage of International Application No. PCT/JP2018/027114 filed Jul. 19, 2018, the entire contents of each of these being incorporated by reference herein in their entirety.

TECHNICAL FIELD

The present invention relates to a solid state imaging device.

BACKGROUND ART

Known solid state imaging devices include a plurality of pixel regions, a plurality of first transfer sections, and a plurality of second transfer sections (for example, see Patent Literature 1). The plurality of pixel regions respectively include a plurality of photosensitive regions that are two-dimensionally arrayed in a first direction and a second direction orthogonal to the first direction, and are distributed in the first direction. Each of the first transfer sections is distributed with the corresponding pixel region of the plurality of pixel regions in the second direction, and transfers a charge generated in the photosensitive region for each corresponding pixel region. Each of the second transfer sections is distributed with the corresponding first transfer section of the plurality of first transfer sections in the second direction, and acquires a charge transferred from the corresponding first transfer section. Each of the second transfer sections transfers the acquired charge in the first direction.

CITATION LIST

Patent Literature

Patent Literature 1: Japanese Unexamined Patent Publication No. 2000-350100

SUMMARY OF INVENTION

Technical Problem

There is a case where one solid state imaging device includes a plurality of read ports in order to increase a frame rate in a solid state imaging device. In this case, for example, it is necessary to secure a space to dispose an amplifier for each read port. In the solid state imaging device described in Patent Literature 1, a length of the first transfer section in the second direction gradually increases in a charge transfer direction in the second transfer section corresponding to the first transfer section. The second transfer section corresponding to the first transfer section extends along a direction intersecting the first direction and the second direction such that a distance from the pixel region becomes gradually longer in the charge transfer direction. The amplifier is disposed in a space between the second transfer sections adjacent in the first direction.

In the solid state imaging device described in Patent Literature 1, the length in the second direction gradually increases in the charge transfer direction in the second transfer section in the entire range of the first transfer section in the first direction. The first transfer section is positioned between the pixel region and the second transfer section in the second direction. In the entire range of the first transfer section in the first direction, the distance between the pixel region and the second transfer section gradually increases in the charge transfer direction in the second transfer section. Therefore, a charge transfer distance along the second direction from the pixel region to the second transfer section becomes long. The entire second transfer section extends along a direction intersecting the first direction and the second direction. In this case, the charge that tries to move in the charge transfer direction along the first direction is transferred while hitting a boundary with the first transfer section in the second transfer section. Therefore, charge transfer efficiency in the second transfer section may deteriorate due to inhibition by a potential of the first transfer section.

An object of one aspect of the present invention is to provide a solid state imaging device that improves charge transfer efficiency.

Solution to Problem

One aspect of the present invention is a solid state imaging device including a plurality of pixel regions, a plurality of first transfer sections, and a plurality of second transfer sections. The plurality of pixel regions each includes a plurality of photosensitive regions that is two-dimensionally arrayed in a first direction and a second direction orthogonal to the first direction, and is distributed in the first direction. Each of the plurality of first transfer sections is distributed with a corresponding pixel region of the plurality of pixel regions in the second direction, and is arranged to transfer a charge generated in the photosensitive region for each corresponding pixel region. Each of the plurality of second transfer sections is distributed with a corresponding first transfer section of the plurality of first transfer sections in the second direction, is arranged to acquire a charge transferred from the corresponding first transfer section, and is arranged to transfer the acquired charge in the first direction. Each of the first transfer sections includes a first region including a plurality of first transfer column regions distributed in the first direction; and a second region including a plurality of second transfer column regions distributed in the first direction. The second region is positioned downstream of the first region in the charge transfer direction in the second transfer section. Lengths in the second direction of the plurality of first transfer column regions are equal. Lengths in the second direction of the plurality of second transfer column regions are longer than the length of the first transfer column region, and increase as the second transfer column region is positioned downstream in the charge transfer direction. Each of the second transfer sections includes a third region disposed to correspond to the first region and a fourth region disposed to correspond to the second region. The third region extends along the first direction. The fourth region extends along a direction intersecting the first direction and the second direction such that an interval between the fourth region and the pixel region in the second direction increases in the charge transfer direction in response to a change in the lengths of the plurality of second transfer column regions.

In the one aspect, a charge transfer distance along the second direction in each of the first transfer column regions is shorter than a charge transfer distance along the second direction in each of the second transfer column regions. Therefore, the charge transfer distance along the second direction is short in the one aspect as compared with a configuration in which the length in the second direction of the entire transfer column region included in the first transfer section gradually increases in the charge transfer direction in the second transfer section.

In the third region of the above aspect, a charge that tries to move in the charge transfer direction along the first direction tends not to hit a boundary with the first transfer section in the second transfer section. Therefore, the charge transfer in the second transfer section tends not to be inhibited by a potential of the first transfer section. The one aspect improves charge transfer efficiency in the second transfer section as compared with a configuration in which an entire second transfer section extends along the direction intersecting the first direction and the second direction.

As described above, the solid state imaging device according to the one aspect improves charge transfer efficiency.

In the one aspect, each of the second transfer column regions may include a first impurity region and a second impurity region having a higher impurity concentration than that of the first impurity region. In each of the second transfer column regions, the second impurity region may be provided from one end positioned closer to the pixel region in the second direction or a vicinity of the one end to another end closer to the second transfer section. A width of the second impurity region in the first direction may increase in a vertical transfer direction from the one end to the other end. In a case in which the width of the second impurity region in the first direction increases in the vertical transfer direction, an electrical potential gradient in which an electrical potential increases in the vertical transfer direction is formed in each of the second transfer column regions. Therefore, each of the second transfer column regions having a long charge transfer distance from the pixel region to the second transfer section also efficiently transfers the charge due to this electrical potential gradient.

In the one aspect, the width of the second impurity region in each section, obtained by dividing the second transfer column region into n sections in the second direction, may be set such that an electrical potential difference of the second impurity region between adjacent sections is constant. In this case, n is an integer of two or more. In this configuration, the electrical potential gradient in the second transfer column region is approximately constant. Therefore, the second transfer column region transfers the charge more efficiently.

The one aspect may further include a plurality of output sections. In this case, the plurality of output sections is arranged to acquire a charge from a rear end in the charge transfer direction of a corresponding second transfer section of the plurality of second transfer sections, and to output a signal corresponding to the acquired charge. The output section may be disposed in a region surrounded by the corresponding second transfer section and the second transfer section adjacent to the corresponding second transfer section in the charge transfer direction. Even in a case in which a width of the second transfer section in the first direction is not smaller than a width of the pixel region in the first direction, this configuration ensures the region surrounded by the corresponding second transfer section and the second transfer section adjacent to the corresponding second transfer section in the charge transfer direction. The output section that outputs the signal corresponding to the charge acquired from the corresponding second transfer section is disposed in this region. Therefore, the charge transfer direction tends not to bends from the second transfer section toward the output section in this configuration. This configuration improves the charge transfer efficiency and facilitates a design of the solid state imaging device.

Advantageous Effects of Invention

According to one aspect of the present invention, the solid state imaging device that improves the charge transfer efficiency is provided.

BRIEF DESCRIPTION OF DRAWINGS

FIGS. 4A and 4B are views illustrating a change in electrical potential formed in the solid state imaging device.

FIG. 7 is a table illustrating a width of the second impurity region at each equally dividing point.

DESCRIPTION OF EMBODIMENTS

Hereinafter, embodiments of the present invention will be described in detail with reference to the accompanying drawings. The same reference signs will be used for the same elements or elements having the same functions in the description, and redundant descriptions will be omitted.

Figure 1:
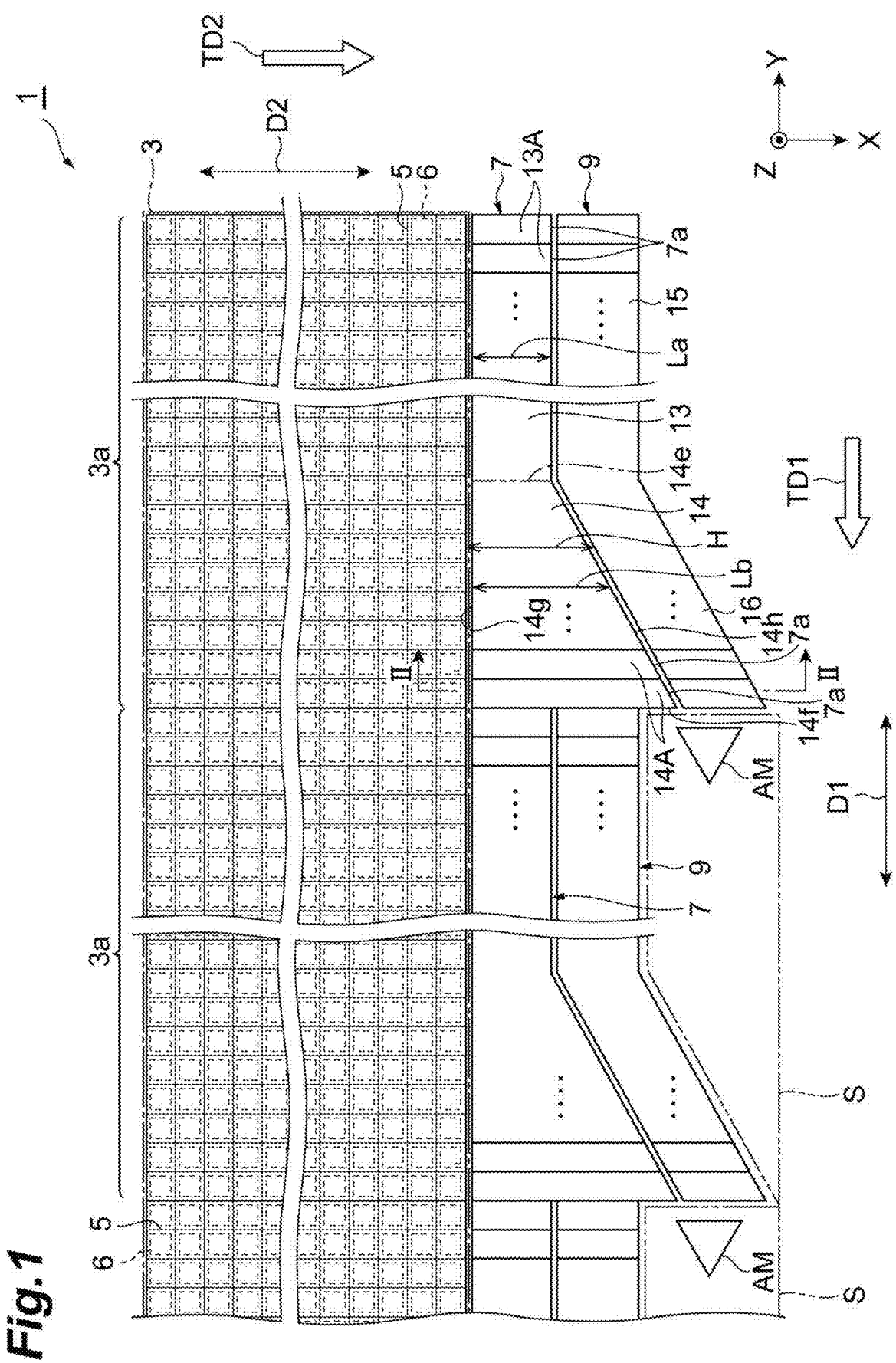
FIG. 1 is a view illustrating a planar configuration of a solid state imaging device.
Figure 2:
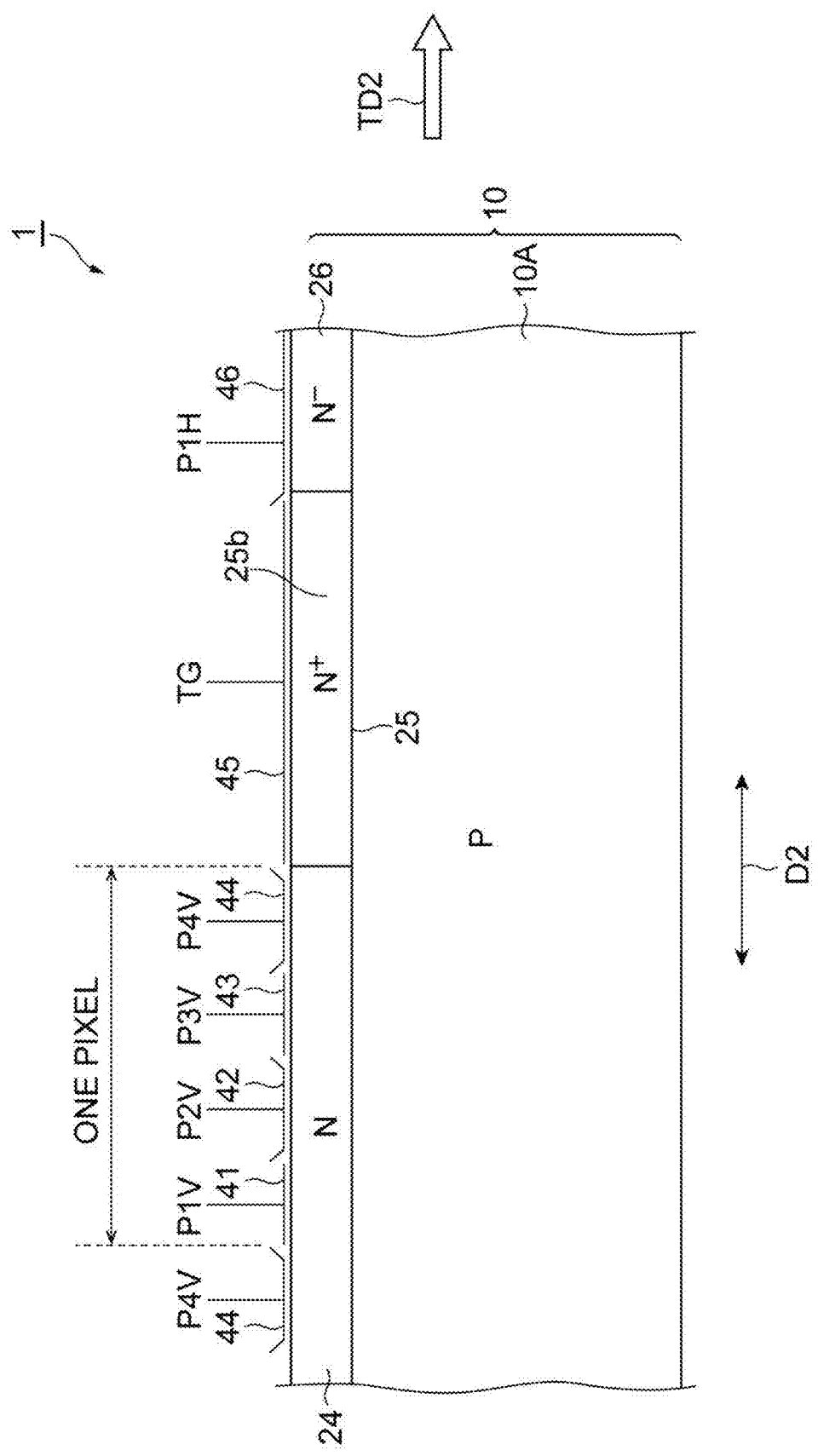
FIG. 2 is a view illustrating a cross-sectional configuration of the solid state imaging device.

First, a configuration of a solid state imaging device 1 according to the present embodiment will be described with reference to FIGS. 1 and 2. FIG. 1 is a view illustrating a planar configuration of the solid state imaging device. FIG. 2 is a view illustrating a cross-sectional configuration of the solid state imaging device. FIG. 2 illustrates the cross-sectional configuration of the solid state imaging device taken along line II-II in FIG. 1.

As illustrated in FIG. 1, the solid state imaging device 1 includes a plurality of pixel regions 3a, a plurality of transfer sections 7, a plurality of shift registers 9, and a plurality of amplifiers AM. In the present embodiment, for example, the transfer section 7 includes a first transfer section, the shift register 9 includes a second transfer section, and the amplifier AM includes an output section.

The pixel region 3a has a rectangular shape in plan view. The rectangular shape has, for example, a pair of short sides opposing each other in a first direction D1 and a pair of long sides opposing each other in a second direction D2. In the present embodiment, the first direction D1 includes both a positive direction and a negative direction along the Y axis. The second direction D2 includes both a positive direction and a negative direction along the X axis. The first direction D1 and the second direction D2 are orthogonal to each other. The plurality of pixel regions 3a is distributed in the first direction D1. The plurality of pixel regions 3a constitutes a light receiving region 3. The light receiving region 3 includes the plurality of pixel regions 3a. The light receiving region 3 is divided into the plurality of pixel regions 3a in the first direction D1.

The pixel region 3a includes a plurality of photoelectric converters 5. The plurality of photoelectric converters 5 is two-dimensionally arrayed in the first direction D1 and the second direction D2. Each of the photoelectric converters 5 includes a photosensitive region 6 that generates a charge in response to incident light. In the present embodiment, one photoelectric converter 5 includes one photosensitive region 6. The photosensitive regions 6 are two-dimensionally arrayed in the first direction D1 and the second direction D2. One photosensitive region 6 (photoelectric converter 5) forms one pixel in the pixel region 3a. Each of the pixel regions 3a includes the plurality of photosensitive regions 6 which are two-dimensionally arrayed.

The plurality of transfer sections 7 correspond to the plurality of pixel regions 3a, respectively. Each of the transfer sections 7 is disposed to be adjacent to the long side of a corresponding pixel region 3a of the plurality of pixel regions 3a. Each of the transfer sections 7 is disposed in the second direction D2 to be adjacent to the long side of the corresponding pixel region 3a and distributed with the corresponding pixel region 3a. The transfer section 7 is positioned between the pixel region 3a and the shift register 9. The transfer section 7 transfers a charge generated in a photosensitive region 6 of the corresponding pixel region 3a. The transfer section 7 acquires the charge discharged from the pixel region 3a and transfers the acquired charge to the shift register 9.

Each of the transfer sections 7 includes a plurality of transfer column regions 7a. The plurality of transfer column regions 7a is distributed in the first direction D1 to correspond to columns of the photosensitive regions 6 distributed in the first direction D1, that is, correspond to pixel columns. The transfer column region 7a transfers a charge generated in the photosensitive region 6 of the corresponding pixel column. The transfer column region 7a acquires the charge from the corresponding pixel column and transfers the acquired charge to the shift register 9.

Each of the transfer sections 7 includes a first region 13 and a second region 14. The second region 14 is positioned downstream of the first region 13 in a charge transfer direction in the corresponding shift register 9. In the present embodiment, the charge transfer direction in the shift register 9 means a direction from the first region 13 toward the second region 14 along the first direction D1. In the present embodiment, the charge transfer direction in the shift register 9 is the negative Y-axis direction. Hereinafter, the charge transfer direction in the shift register 9 is referred to as a "horizontal transfer direction TD1". A downstream in the horizontal transfer direction TD1 means that the order of charge transfer in the charge transfer direction is late. The first region 13 is positioned upstream of the second region 14 in the horizontal transfer direction TD1, and the second region 14 is positioned downstream of the first region 13 in the horizontal transfer direction TD1.

In the first region 13, the transfer column region 7a includes first transfer column regions 13A. Therefore, each of the first regions 13 includes the plurality of first transfer column regions 13A. Lengths La of the respective first transfer column regions 13A in the second direction D2 are equal. In the present embodiment, the expression that the lengths La are equal means not only that values are exactly the same but also that a difference in the values is included in a measurement error or a preset range of about ±1 µm. In each of the first regions 13, the lengths La of the plurality of first transfer column regions 13A are equal, and the plurality of first transfer column regions 13A are distributed in the first direction D1. Therefore, each of the first regions 13 has a rectangular shape in plan view. This rectangular shape has a pair of short sides opposing each other in the first direction D1 and a pair of long sides opposing each other in the second direction D2. The length La is, for example, 7 µm.

In the second region 14, the transfer column region 7a includes second transfer column regions 14A. Therefore, each of the second regions 14 includes the plurality of second transfer column regions 14A. Lengths Lb of the respective second transfer column regions 14A in the second direction D2 are longer than the length La. The lengths Lb increase as the second transfer column region 14A is positioned downstream in the horizontal transfer direction TD1. In the second region 14, the trapezoidal second transfer column regions 14A are distributed in the first direction D1 such that the lengths Lb increase as the second transfer column region 14A is positioned downstream in the horizontal transfer direction TD1. Therefore, the second region 14 has a trapezoidal shape in plan view. This trapezoidal shape has a pair of sides 14e and 14f opposing each other in the first direction D1 and a pair of sides 14g and 14h opposing each other in the second direction D2, and further, has a width increasing from the side 14e toward the side 14f.

Sides, adjacent to the pixel region 3a, of the respective second transfer column regions 14A are distributed in a straight line in the first direction D1. The sides, adjacent to the pixel region 3a, of the respective second transfer column regions 14A constitute the side 14g of the second region 14. The side 14g extends linearly in the first direction D1. Sides, adjacent to the shift register 9, of the respective second transfer column regions 14A are a distributed in a straight line in such a manner as to intersect the first direction D1 and the second direction D2 at the same angle. The sides, adjacent to the shift register 9, of the respective second transfer column regions 14A constitute the side 14h of the second region 14. The side 14h extends linearly to intersect the first direction D1 and the second direction D2 at a predetermined angle.

The length Lb becomes the maximum at a position of the side 14f. The maximum value of the length Lb is, for example, 50 µm. The maximum length of the second region 14 in the second direction D2, that is, the length of the side 14f is longer than a sum of lengths in the second direction D2 of the first region 13 and shift register 9 that are adjacent in the first direction D1 to the second transfer column region 14A positioned most downstream in the horizontal transfer direction TD1 in the second region 14. The length of the side 14f is longer than the sum of the length La and the length of the shift register 9 in the second direction D2.

The side 14e is one end of the second region 14 in the first direction D1. The side 14e is positioned closer to the first region 13 in the first direction D1. The side 14f is another end of the second region 14 in the first direction D1. The side 14f is positioned opposite to the first region 13 in the first direction D1. The side 14g is one end of the second region 14 in the second direction D2. The side 14g is positioned closer to the pixel region 3a in the second direction D2. The side 14h is another end of the second region 14 in the second direction D2. The side 14h is positioned closer to the shift register 9 in the second direction D2. Hereinafter, a direction from the pixel region 3a to the shift register 9 along the direction from the side 14g toward the side 14h, that is, along the second direction D2, is referred to as a "vertical transfer direction TD2".

A width of the first region 13 in the first direction D1 is larger than a width of the second region 14 in the first direction D1. The number of the first transfer column regions 13A distributed in the first direction D1 is larger than the number of the second transfer column regions 14A distributed in the first direction D1. For example, the width of the first region 13 in the first direction D1 is about 10 times the width of the second region 14 in the first direction D1. In this case, a ratio between the number of the first transfer column regions 13A and the number of the second transfer column regions 14A is about 10:1.

Figure 3:
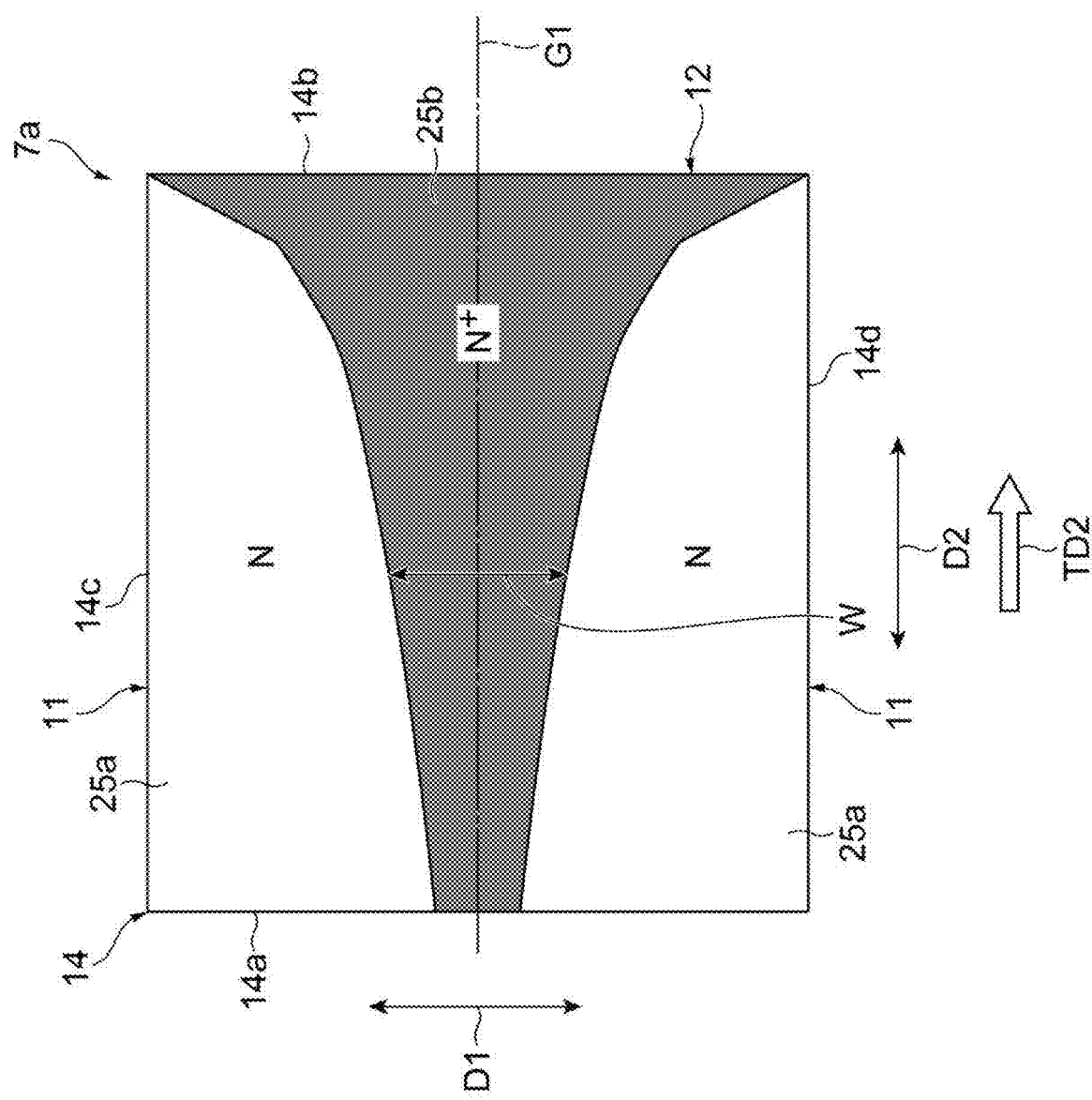
FIG. 3 is a schematic view illustrating a second transfer column region.

Each of the second transfer column regions 14A includes a plurality of impurity regions having different impurity concentrations. FIG. 3 is a schematic view illustrating the second transfer column region. Although the second transfer column region 14A has the trapezoidal shape in plan view as described above, the second transfer column region 14A in FIG. 3 is schematically illustrated as a rectangular shape having a pair of short sides 14a and 14b and a pair of long sides 14c and 14d.

As illustrated in FIG. 3, the second transfer column region 14A includes a pair of first impurity regions 11 and a second impurity region 12. An impurity concentration of the second impurity region 12 is higher than an impurity concentration of the first impurity region 11. Configurations of the first impurity region 11 and the second impurity region 12 will be described later.

The second impurity region 12 is provided from one short side 14a to the other short side 14b in the second direction D2 in the second transfer column region 14A. In the present embodiment, the second impurity region 12 is continuously provided from the short side 14a to the short side 14b. The short side 14a constitutes a part of the side 14g of the second region 14. The short side 14a is the one end of the second transfer column region 14A (second region 14) in the second direction D2. The short side 14a is positioned closer to the pixel region 3a in the second direction D2. The short side 14b constitutes a part of the side 14h of the second region 14. The short side 14b is the other end of the second transfer column region 14A (second region 14) in the second direction D2. The short side 14b is positioned closer to the shift register 9 in the second direction D2. The second impurity region 12 is positioned between the pair of first impurity regions 11 in the first direction D1.

The second impurity region 12 has a shape that is line-symmetric with respect to a center line G1 of the second transfer column region 14A along the second direction D2 in plan view of FIG. 3. In FIG. 3, a planar shape of the second impurity region 12 is line-symmetric with respect to the center line G1. The center line G1 is parallel to the pair of long sides 14c and 14d of the second transfer column region 14A and is positioned such that distances from the long sides 14c and 14d are equivalent. In the present embodiment, "equivalent" not only means that values are exactly the same, but also means that a difference in values is included in the range of a measurement error or a preset minute difference. The expression that the planar shape of the second impurity region 12 is line-symmetric with respect to the center line G1 represents that regions, obtained by dividing the second impurity region 12 by the center line G1 and positioned with the center line G1 therebetween, are mirror-symmetric, and the regions has the same area and number. The center line G1 is a mirror symmetry axis.

A width W of the second impurity region 12 in the first direction D1 increases in the direction from the short side 14a toward the short side 14b. The shape of the second impurity region 12 will be described later with reference to FIG. 5.

The second impurity region 12 forms an electrical potential gradient that increases in the positive X-axis direction of FIG. 1 in the second transfer column region 14A. The electrical potential gradient increases in the direction from the short side 14a to the short side 14b along the direction in which the pair of short sides 14a and 14b oppose each other, that is, along the second direction D2. This electrical potential gradient transfers a charge transferred from the photosensitive region 6 to the second transfer column region 14A in the direction from the short side 14a to the short side 14b in the second transfer column region 14A. The electrical potential gradient transfers the charge in the vertical transfer direction TD2. The charge that has reached the short side 14b is discharged from the second transfer column region 14A.

As illustrated in FIG. 1, each of the shift registers 9 is disposed such that the corresponding transfer section 7 is positioned between the corresponding pixel region 3a and the shift register 9. Each of the shift registers 9 is disposed near the long side of each of the pixel regions 3a. Each of the shift registers 9 is adjacent to the corresponding transfer section 7 in the second direction D2. The pixel region 3a, the transfer section 7, and the shift register 9 are distributed in the order of the pixel region 3a, the transfer section 7, and the shift register 9 in the second direction D2. The shift register 9 acquires the charge transferred from the transfer section 7, transfers the acquired charge in the horizontal transfer direction TD1 (negative Y-axis direction), and sequentially outputs the charge to the amplifier AM. The amplifier AM converts the charge output from the shift register 9 into a voltage, and outputs the converted voltage to the outside of the solid state imaging device 1 as an output of each of the photosensitive regions 6. The amplifier AM constitutes a read port.

The shift register 9 includes a third region 15 and a fourth region 16. The third region 15 is disposed at a position corresponding to the first region 13. The fourth region 16 is disposed at a position corresponding to the second region 14. The third region 15 is disposed closer to the long side of the first region 13 in the second direction D2, and extends along the first direction D1. The third region 15 has a rectangular shape in plan view. This rectangular shape has a pair of short sides opposing each other in the first direction D1 and a pair of long sides opposing each other in the second direction D2. In the present embodiment, a width of the third region 15 in the first direction D1 is approximately the same as the width of the first region 13 in the first direction D1.

The fourth region 16 is disposed closer to the side 14h of the second region 14 in the second direction D2. The fourth region 16 extends along a direction intersecting the first direction D1 and the second direction D2 such that an interval H between the fourth region 16 and the pixel region 3a in the second direction D2 increases in the horizontal transfer direction TD1 in response to a change in the length Lb. The fourth region 16 has a parallelogram shape in plan view. This parallelogram shape has a pair of short sides opposing each other in the first direction D1 and a pair of long sides opposing each other in the second direction D2.

Each long side of the fourth region 16 is parallel to the side 14h of the second region 14. Each long side of the fourth region 16 extends linearly in such a manner as to intersect the first direction D1 and second direction D2 at a predetermined angle. A width of each long side of the fourth region 16 in the first direction D1 is larger than a width of each long side of the fourth region 16 in the second direction D2. An angle formed by each long side of the fourth region 16 with respect to the first direction D1 is smaller than an angle formed by each long side of the fourth region 16 with respect to the second direction D2. The fourth region 16 extends to be inclined such that the angle with respect to the first direction D1 is smaller than the angle with respect to the second direction D2. The fourth region 16 is inclined at a gentle angle closer to the first direction D1 (Y-axis direction) than to the second direction D2 (X-axis direction). For example, the fourth region 16 is inclined at an angle smaller than 45° with respect to the first direction D1.

The width of the fourth region 16 in the first direction D1 is approximately the same as the width of the second region 14 in the first direction D1. A length of the fourth region 16 in the second direction D2 is approximately the same as a length of the third region 15 in the second direction D2. A width of the shift register 9 in the second direction D2 is approximately constant regardless of a position in the horizontal transfer direction TD1.

Each of the amplifiers AM acquires a charge from a rear end in the horizontal transfer direction TD1 of the corresponding shift register 9, and outputs a voltage (signal) corresponding to the acquired charge. The amplifier AM is disposed in a region S. The region S is a region surrounded by the corresponding shift register 9 and the shift register 9 adjacent to the corresponding shift register 9 in the horizontal transfer direction TD1. The region S is also a region surrounded by the shift register 9 that transfers and outputs a charge generated in one pixel region 3a and the shift register 9 that transfers and outputs a charge generated in the other pixel region 3a, among two pixel regions 3a adjacent in the first direction D1. In the present embodiment, one amplifier AM is disposed in the region S and provided in one pixel region 3a. The solid state imaging device 1 includes the plurality of amplifiers AM for one light receiving region 3. In the solid state imaging device 1, one amplifier AM is provided for one pixel region 3a by being disposed in the region S. The solid state imaging device 1 is a multi-port solid state imaging device including a plurality of output sections (a plurality of read ports).

Isolation regions are disposed between the photosensitive regions 6 adjacent in the first direction D1 and between the transfer sections 7 adjacent in the first direction D1. The isolation region disposed between the photosensitive regions 6 electrically isolates the adjacent photosensitive regions 6 from each other. The isolation region disposed between the transfer sections 7 electrically isolates the adjacent transfer sections 7 from each other.

The solid state imaging device 1 includes a semiconductor substrate 10. The light receiving region 3, the plurality of transfer sections 7, and the plurality of shift registers 9 are formed on the semiconductor substrate 10. In the present embodiment, the semiconductor substrate 10 is a silicon substrate. As illustrated in FIG. 2, the semiconductor substrate 10 includes a main part layer 10A serving as a base of the semiconductor substrate 10 and surface layers 24 to 26. The surface layers 24 to 26 are formed on one side of the main part layer 10A.

The main part layer 10A is a p type semiconductor layer. The surface layer 24 is an n type semiconductor layer. As illustrated in FIG. 3, the surface layer 25 includes a pair of n type semiconductor layers 25a and one $n^+$ type semiconductor layer 25b. The $n^+$ type semiconductor layer 25b is positioned between the pair of n type semiconductor layers 25a in the first direction D1. The surface layer 26 is an n type semiconductor layer. The respective conductivity types of the p type and the n type may be switched so as to be opposite to the above-described conductivity types.

A high impurity concentration is indicated by "+" attached to a conductivity type. A low impurity concentration indicated by "−" attached to a conductivity type. The low impurity concentration also includes an aspect in which some impurities of a conductivity type attached with "−" are compensated with impurities of a conductivity type opposite to the conductivity type attached with "−" so that a low impurity concentration is obtained in appearance. The number of "+" indicates the degree of concentration of impurities of a conductivity type attached with "+", and the larger number of "+" means a higher concentration of impurities of the conductivity type attached with "+". The n type impurity is, for example, N, P, or As. The p type impurity is, for example, B or Al.

A pn junction is formed at an interface between the main part layer 10A and the surface layer 24. The surface layer 24 constitutes the pixel region 3a. A plurality of electrodes 41 to 44 is disposed on an insulating layer (not illustrated). The electrodes 41 to 44 are formed on a region of the insulating layer corresponding to the surface layer 24. The electrodes 41 to 44 are indirectly disposed on the surface layer 24. The electrodes 41 to 44 are distributed in the order of the electrode 41, the electrode 42, the electrode 43, and the electrode 44 in the second direction D2. The electrodes 41 to 44 form a set, and a plurality of sets of electrodes 41 to 44 is disposed in the second direction D2. A region of the surface layer 24 positioned below the set of electrodes 41 to 44 constitutes one photosensitive region 6 (one pixel).

A drive circuit (not illustrated) applies signals P1V, P2V, P3V, and P4V to the electrodes 41 to 44, respectively. Each of the signals P1V, P2V, P3V, and P4V determines an electrical potential gradient of the region (photosensitive region 6) of the surface layer 24 positioned below the set of electrodes 41 to 44. The set of electrodes 41 to 44 forms an inclination of a potential that gradually becomes deeper in the vertical transfer direction TD2 in the region positioned below the set of electrodes 41 to 44. The set of electrodes 41 to 44 forms an electrical potential gradient that increases in the vertical transfer direction TD2. A charge generated in the photosensitive region 6 in response to incident light moves in the vertical transfer direction TD2 along the formed inclination of the potential. The drive circuit is controlled by a control device (not illustrated).

As illustrated in FIG. 3, the n type semiconductor layer 25a of the surface layer 25 constitutes the first impurity region 11 of the second transfer column region 14A. A shape of the first impurity region 11 corresponds to a shape of the n type semiconductor layer 25a. The $n^+$ type semiconductor layer 25b of the surface layer 25 constitutes the second impurity region 12 of the second transfer column region 14A. A shape of the second impurity region 12 corresponds to a shape of the $n^+$ type semiconductor layer 25b.

An impurity concentration of the $n^+$ type semiconductor layer 25b is higher than an impurity concentration of the n type semiconductor layer 25a. A width W of the high $n^+$ type semiconductor layer 25b gradually increases in the vertical transfer direction TD2. The width W of the $n^+$ type semiconductor layer 25b is small in a region near the short side 14a in the vertical transfer direction TD2. In a case in which the width W of the n⁺ type semiconductor layer 25b is small, an influence of fringing electric fields from the n type semiconductor layers 25a positioned on both sides of the n⁺ type semiconductor layer 25b is large. Therefore, a potential of the surface layer 25 is shallow in the region near the short side 14a in the vertical transfer direction TD2. The width W of the n⁺ type semiconductor layer 25b is large in a region near the short side 14b in the vertical transfer direction TD2. In a case in which the width W of the n⁺ type semiconductor layer 25b is large, the influence of fringing electric fields from the n type semiconductor layers 25a positioned on both sides of the n⁺ type semiconductor layer 25b is small. Therefore, a potential of the surface layer 25 is deep in the region near the short side 14b in the vertical transfer direction TD2. Consequently, the surface layer 25 is formed with an inclination of a potential that gradually becomes deeper in the vertical transfer direction TD2 as illustrated in FIGS. 4A and 4B. The surface layer 25 is formed with an electrical potential gradient that gradually increases in the vertical transfer direction TD2. FIGS. 4A and 4B are views illustrating a change in electrical potential formed in the solid state imaging device.

An electrode 45 is also disposed on the insulating layer. The electrode 45 is formed on a region of the insulating layer corresponding to the surface layer 25. The electrode 45 is indirectly disposed on the surface layer 25. The surface layer 25 and the electrode 45 constitute the second transfer column region 14A (the second region 14 of the transfer section 7). The drive circuit gives a signal TG to the electrode 45. In response to the signal TG, the potential of the surface layer 25 changes, for example, as illustrated in FIGS. 4A and 4B. Due to the change of the potential, the second transfer column region 14A (the second region 14 of the transfer section 7) acquires a charge from the photosensitive region 6 and sends the acquired charge to the shift register 9.

Since the first transfer column region 13A (the first region 13 of the transfer section 7) has a conventionally known configuration, the first transfer column region 13A is not illustrated. The first transfer column region 13A is constituted by, for example, a surface layer and an electrode that is indirectly disposed on the surface layer, which is similar to the conventional solid state imaging device. This surface layer does not include a plurality of impurity regions having different impurity concentrations. The surface layer is, for example, an n type semiconductor layer.

An electrode 46 is also disposed on the insulating layer. The electrode 46 is formed on a region of the insulating layer corresponding to the surface layer 26. The electrode 46 is indirectly disposed on the surface layer 26. The surface layer 26 and the electrode 46 constitute the shift register 9. The drive circuit gives a signal P1H to the electrode 46. In response to the signal P1H, the potential of the surface layer 26 changes, for example, as illustrated FIGS. 4A and 4B. Due to the change of the potential, the shift register 9 acquires a charge from the transfer section 7 and sends the acquired charge to the amplifier AM.

The electrodes 41 to 46 are made of, for example, a polysilicon film. The above-described insulating layer is made of, for example, a silicon oxide film.

Figure 5:
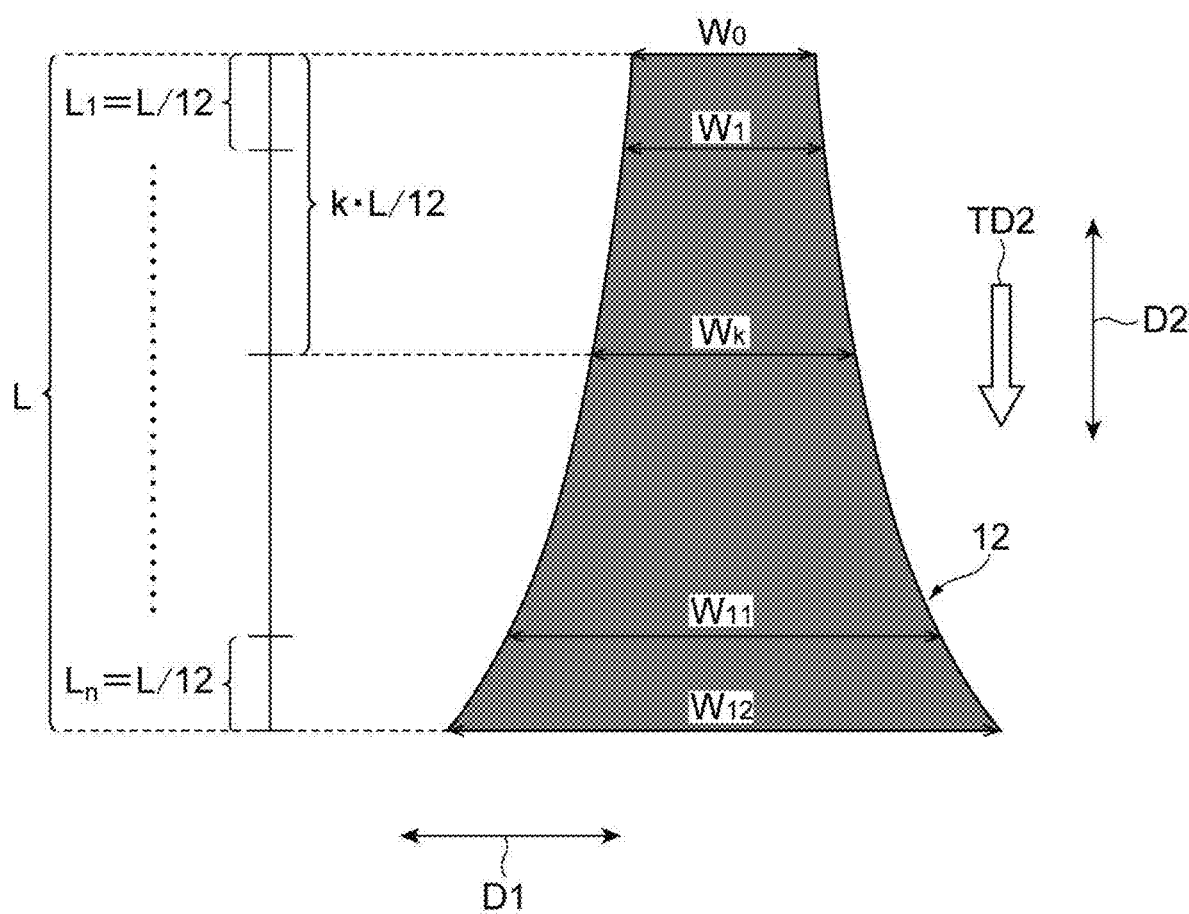
FIG. 5 is a view used for describing a width of a second impurity region.

Next, the shape of the second impurity region 12 will be described with reference to FIG. 5. FIG. 5 is a view used for describing the width of the second impurity region. FIG. 5 illustrates width $W_1, \ldots, W_k, \ldots,$ and $W_n$ of the second impurity region 12 in sections $L_1, \ldots, L_k, \ldots,$ and $L_n$ obtained by dividing the second transfer column region 14A into n sections in the second direction D2. The second transfer column region 14A has a length L in the second direction D2. Here, n is an integer of two or more. Here, k is an integer of two or more and n−1 or less. The width $W_0$ is the minimum width in the section L1. The width $W_0$ is the width of the second impurity region 12 at the most upstream end (the short side 14a illustrated in FIG. 3) in the vertical transfer direction TD2 in the second impurity region 12.

In the present embodiment, each of the sections $L_1, \ldots, L_k, \ldots,$ and $L_n$ is each of sections obtained by equally dividing the second transfer column region 14A into n sections in the second direction D2. Although the equal division means division into equal amounts, each of the sections $L_1, \ldots, L_k, \ldots,$ and $L_n$ is not necessarily divided to have the completely equal amount. The width of each of the sections $L_1, \ldots, L_k, \ldots,$ and $L_n$ may include a measurement error or a minute difference within a preset range of about ±several μm. In FIG. 5, the second transfer column region 14A is equally divided into twelve sections.

Each of the widths $W_1, \ldots, W_k, \ldots,$ and $W_n$ of the second impurity region 12 is, for example, a width at a position closest to the short side 14b (see FIG. 3) in each of the sections $L_1, \ldots, L_k, \ldots,$ and $L_n$. In this case, each of the widths $W_1, \ldots, W_k, \ldots,$ and $W_n$ is a width at a downstream end in the vertical transfer direction TD2 in each of the sections $L_1, \ldots, L_k, \ldots,$ and $L_n$, and is the maximum width in each of the sections $L_1, \ldots, L_k, \ldots,$ and $L_n$. The widths $W_1, \ldots, W_k, \ldots,$ and $W_n$ are not limited to the maximum widths in the respective sections $L_1, \ldots, L_k, \ldots,$ and $L_n$. For example, each of the widths $W_1, \ldots, W_k, \ldots,$ and $W_n$ may be an average value of widths in each of the sections $L_1, \ldots, L_k, \ldots,$ and $L_n$.

Increase rates $\Delta W_1, \ldots, \Delta W_k, \ldots,$ and $\Delta W_n$ of the widths $W_1, \ldots, W_k, \ldots,$ and $W_n$ of the second impurity region 12 ($\Delta W_k = W_k - W_{k-1}$) gradually increase in the vertical transfer direction TD2. Within each of the sections $L_1, \ldots, L_k, \ldots,$ and $L_n$, the width W of the second impurity region 12 gradually increases from the upstream side to the downstream side in the vertical transfer direction TD2. Within each of the sections $L_1, \ldots, L_k, \ldots,$ and $L_n$, the width W of the second impurity region 12 monotonously increases in the vertical transfer direction TD2 from the upstream end to the downstream end in the vertical transfer direction TD2. The widths $W_1, \ldots, W_k, \ldots,$ and $W_n$ of the second impurity regions 12 are set such that each of electrical potential differences $\Delta V_1, \ldots, \Delta V_k, \ldots,$ and $\Delta V_n$ ($\Delta V_k = V_k - V_{k-1}$) between adjacent sections among the sections $L_1, \ldots, L_k, \ldots,$ and $L_n$ becomes constant; provided, however, that $\Delta V_1 = V_1 - V_0$. $V_0$ is an electrical potential of the second transfer column region 14A at the position of the width $W_0$.

Next, a process of determining the shape of the second impurity region 12 will be described.

Figure 6:
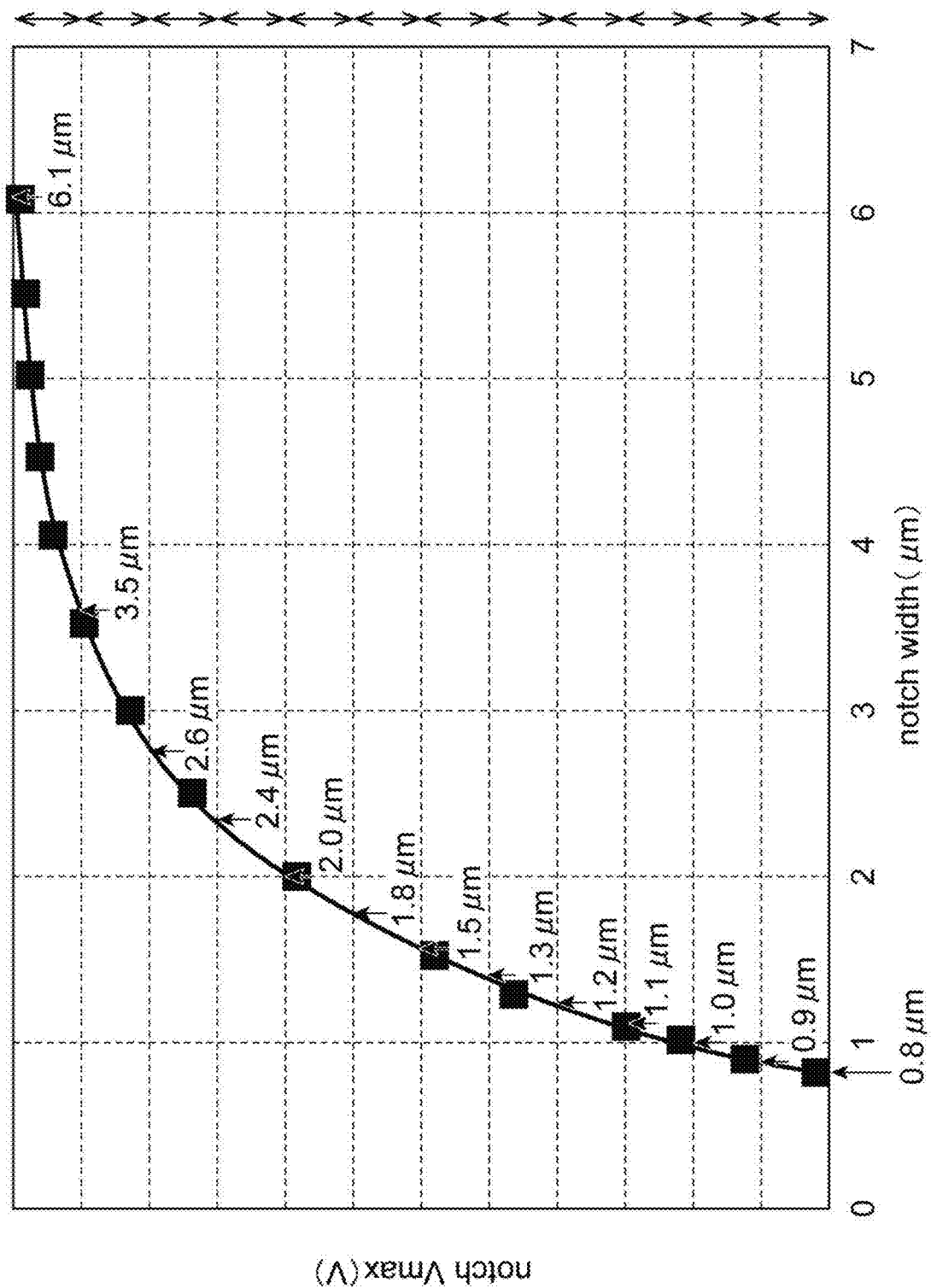
FIG. 6 is a graph illustrating an electrical potential of the second impurity region for each notch width.

First, procedures for obtaining the widths $W_1, \ldots, W_k, \ldots,$ and $W_n$ of the second impurity region 12 will be described. In a first procedure, an electrical potential of the second transfer column region 14A for each predetermined notch width is calculated. At this electrical potential calculation, a model of a solid state imaging device including the second impurity region 12 with a constant notch width in the vertical transfer direction TD2 is used. The maximum electrical potential of the photosensitive region 6 is calculated for each predetermined notch width. The notch width is, for example, a value within the range of 0.8 μm to 6.1 μm. Calculation results are illustrated in FIG. 6. FIG. 6 is a graph illustrating the electrical potential of the second impurity region for each notch width. The horizontal axis in FIG. 6 indicates the notch width [μm]. The vertical axis in FIG. 6 indicates the maximum electrical potential [V] of the second transfer column region 14A corresponding to the notch width. The vertical axis in FIG. 6 indicates that the maximum electrical potential increases in the upward direction, and the maximum electrical potential decreases in the downward direction.

In a second procedure, the electrical potential in the range corresponding to the range where the notch width is 0.8 μm to 6.1 μm is equally divided into n sections in the graph of FIG. 6. In the example illustrated in FIG. 6, for example, the electrical potential is equally divided into twelve sections. The notch widths at the respective equally dividing points (1, ..., k, ... and n) of the electrical potential are read from the graph of FIG. 6. The read notch widths at the respective equally dividing points are defined as the respective widths $W_1, \ldots, W_k, \ldots,$ and $W_n$ of the second impurity region 12 corresponding to the respective equally dividing points.

With the above procedure, the widths $W_1, \ldots, W_k, \ldots,$ and $W_n$ of the second impurity region 12 in which the electrical potential difference in the second transfer column region 14A between adjacent sections is constant are obtained.

FIG. 7 illustrates the widths $W_0, W_1, \ldots, W_k, \ldots,$ and $W_n$ of the obtained second impurity region 12. FIG. 7 is a table illustrating the width of the second impurity region at each equally dividing point.

Next, the shape of the second impurity region 12 is determined based on the obtained widths $W_0, W_1, \ldots, W_k, \ldots,$ and $W_n$ (see FIG. 7). In this procedure, the respective widths $W_0, W_1, \ldots, W_k, \ldots,$ and $W_n$ of the second impurity region 12 are plotted so as to correspond to the respective equally dividing points of n=0, 1, ..., k, ..., and n.

The shape of the second impurity region 12 is determined by the above procedure. The shape of the second impurity region 12 is a shape similar to the shape illustrated in FIG. 5 regardless of the length of the second transfer column region 14A in the vertical transfer direction TD2.

Next, a simulation was performed to illustrate that the shape of the second impurity region 12 is suitable for improvement of charge transfer efficiency. Simulation results are illustrated in FIGS. 8 to 12.

Figure 8:
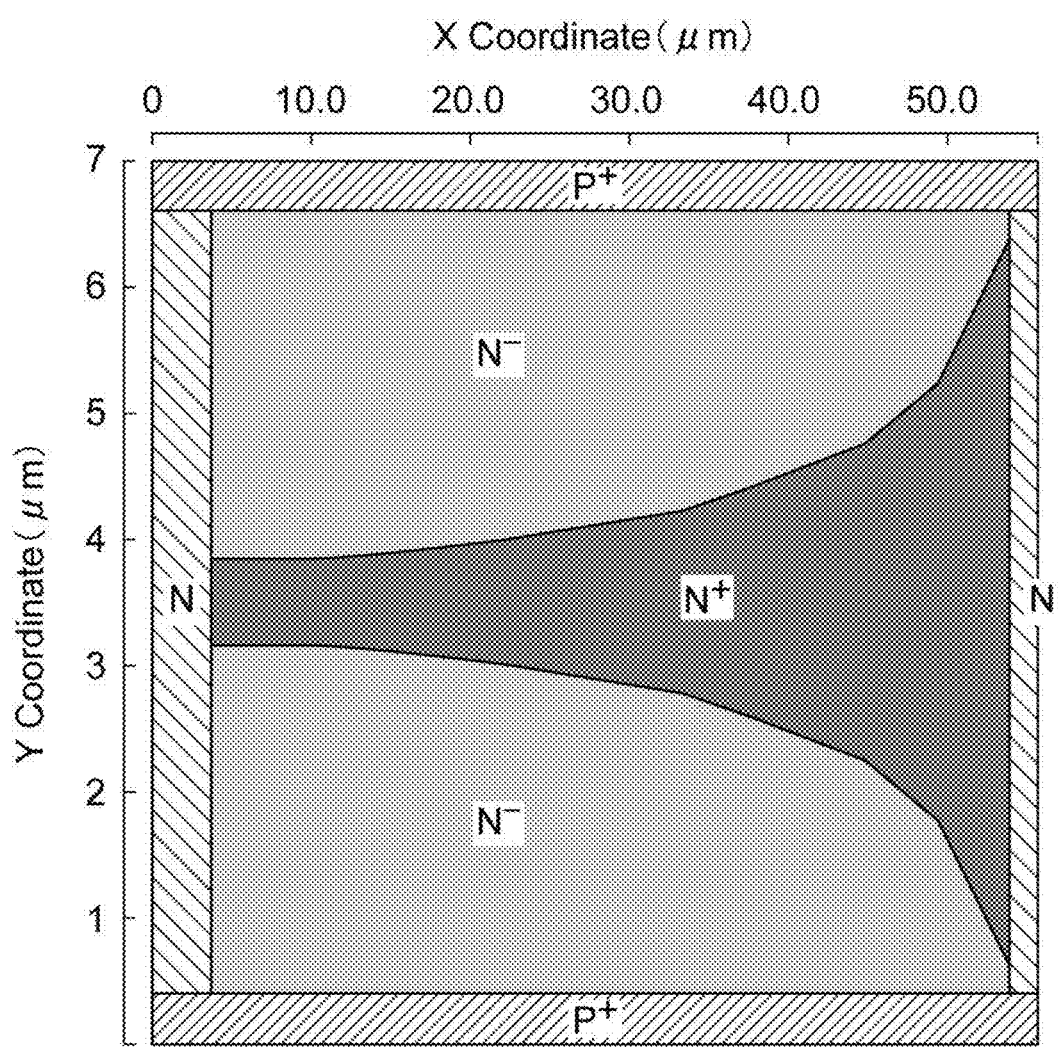
FIG. 8 is a view illustrating a simulation model of the second transfer column region including the second impurity region according to the present embodiment.
Figure 9:
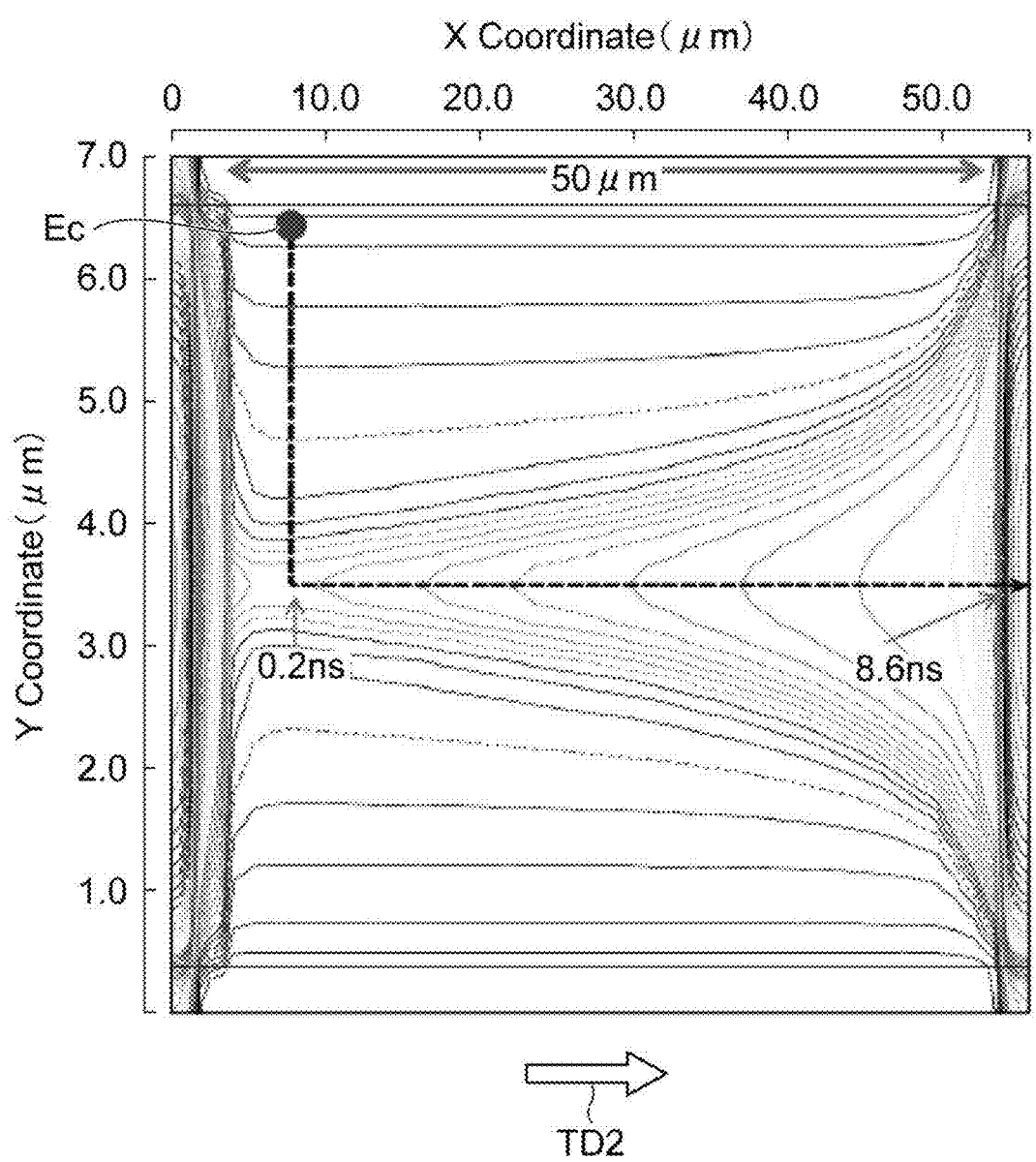
FIG. 9 is a graph illustrating a simulation result of a potential of the second transfer column region.
Figure 10:
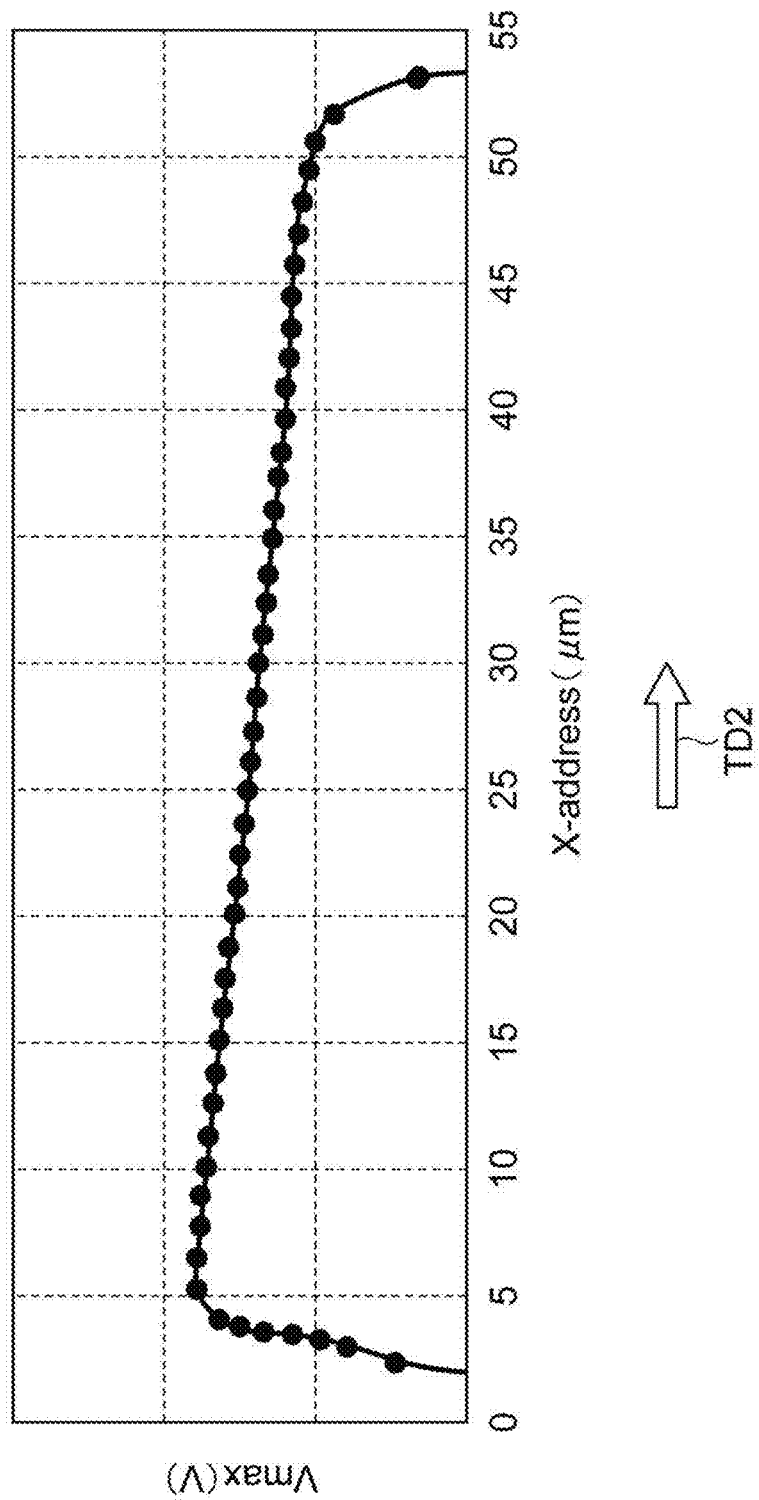
FIG. 10 is a graph illustrating an electrical potential gradient in a transfer direction.
Figure 11:
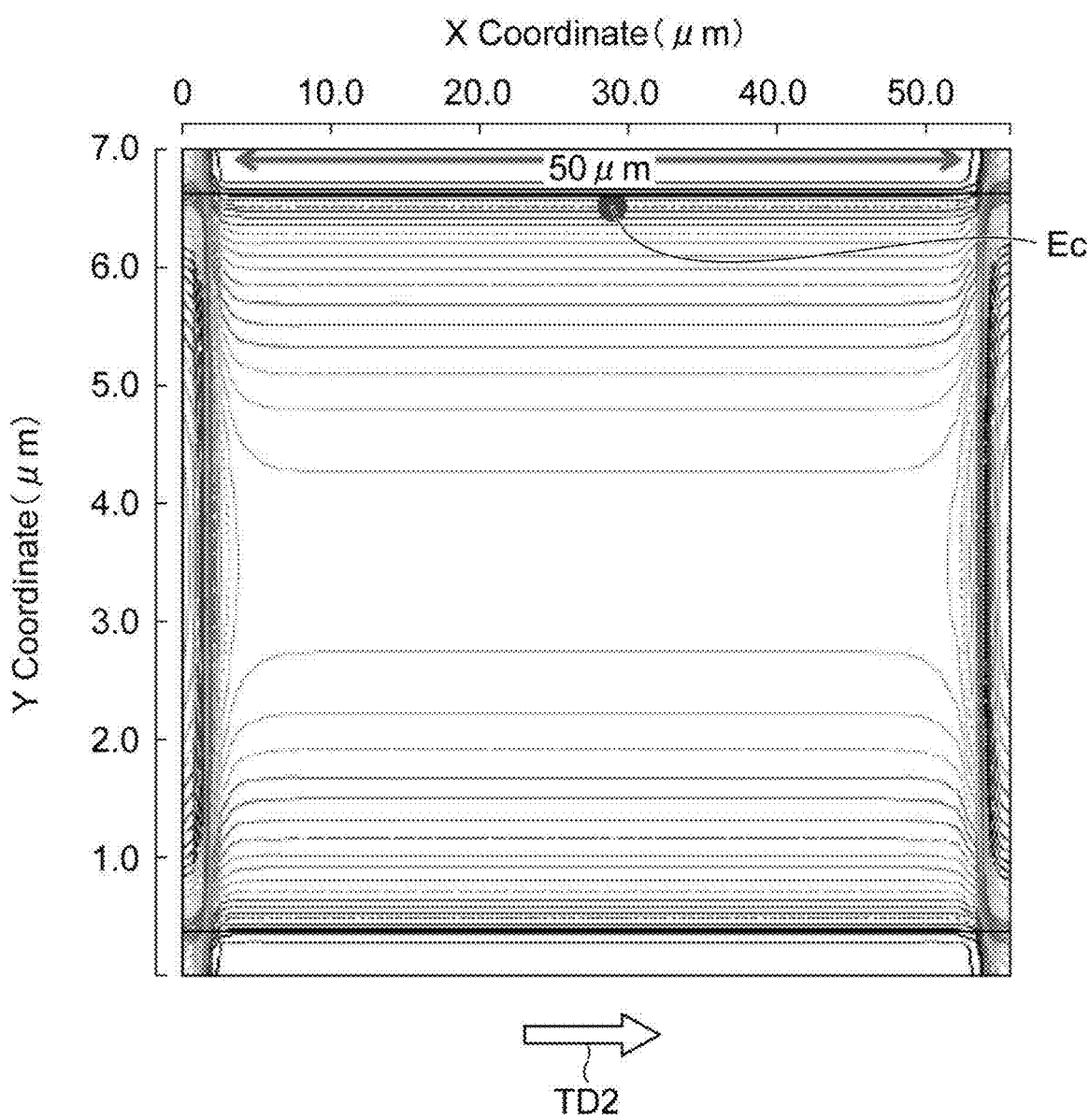
FIG. 11 is a graph illustrating a simulation result of a potential of a second transfer column region according to a reference example.

FIG. 8 is a view illustrating a simulation model of the second transfer column region including the second impurity region according to the present embodiment. FIG. 9 is a graph illustrating a simulation result of a potential of the second transfer column region. The potential illustrated in FIG. 9 is a simulation result of the potential of the second transfer column region 14A using the model illustrated in FIG. 8. In FIG. 9, the potential is indicated by an equipotential line. The positive x-axis direction in FIG. 9 corresponds to the vertical transfer direction TD2. FIG. 10 is a graph illustrating an electrical potential gradient in the transfer direction. FIG. 10 is a graph in which a value of an electrical potential corresponding to a position in the vertical transfer direction TD2 in the second transfer column region 14A is plotted based on the result of FIG. 9. The horizontal axis in FIG. 10 indicates the position [μm] in the vertical transfer direction TD2 (positive x-axis direction) of the second transfer column region 14A. The vertical axis in FIG. 10 indicates the maximum electrical potential [V] of the second transfer column region 14A. The vertical axis in FIG. 10 indicates that the maximum electrical potential decreases in the upward direction, and the maximum electrical potential increases in the downward direction. FIG. 11 is a graph illustrating a simulation result of a potential of a second transfer column region according to a reference example. In the reference example, the second transfer column region 14A does not include the second impurity region 12.

In a case in which the second transfer column region 14A does not include the second impurity region 12 as illustrated in FIG. 11, no electrical potential gradient is formed at the center of the second transfer column region 14A. Therefore, in a case in which the length of the second transfer column region 14A in the second direction D2 is long, for example, in a case in which the length of the second transfer column region 14A in the second direction D2 is about 50 μm, a charge Ec is not likely to be transferred in the vertical transfer direction TD2. In contrast, in a case in which the second transfer column region 14A includes the second impurity region 12 as illustrated in FIGS. 9 and 10, the electrical potential gradient in the second transfer column region 14A is formed to be approximately constant over approximately the entire region along the vertical transfer direction TD2 of the second transfer column region 14A. In this case, the electrical potential gradient in the second transfer column region 14A efficiently transfers the charge Ec in the second transfer column region 14A.

Figure 12A:
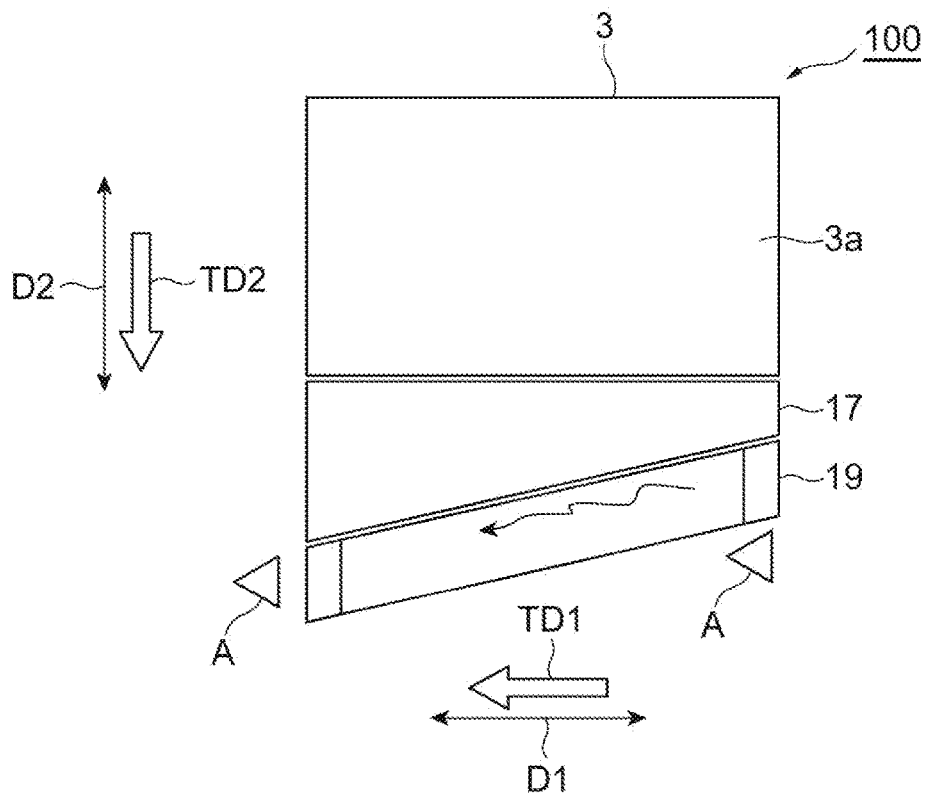
FIGS. 12A and 12B are schematic views illustrating an operation and an effect of the solid state imaging device according to the present embodiment.
Figure 12B:
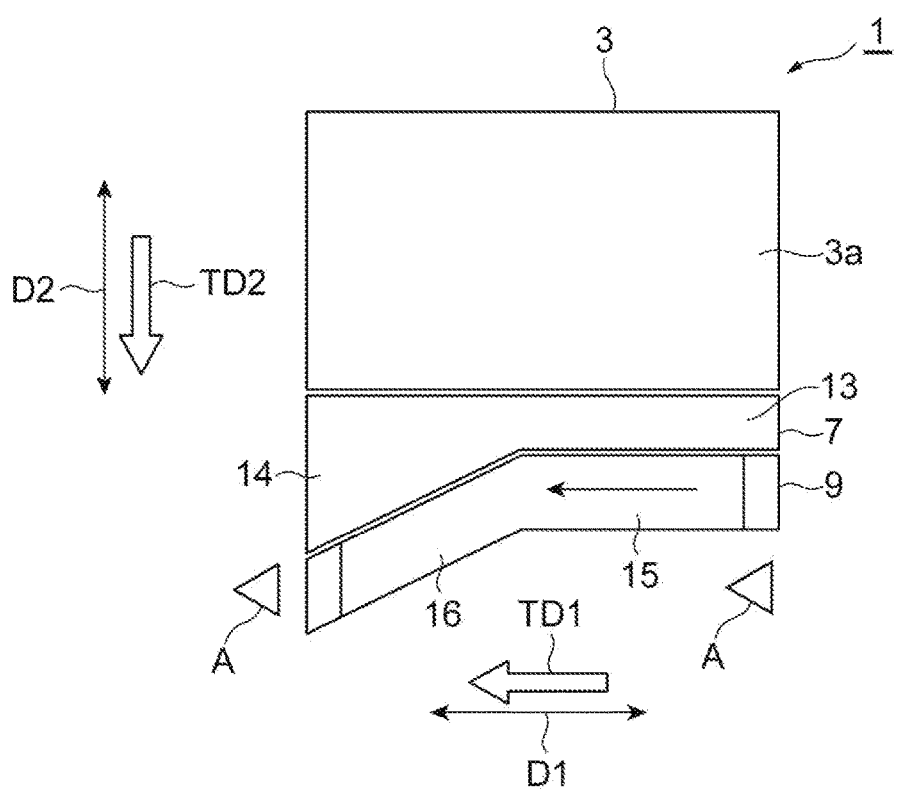

Next, an operation and an effect of the solid state imaging device 1 of the present embodiment will be described with reference to FIGS. 12A and 12B. FIGS. 12A and 12B are schematic views illustrating the operation and effect of the solid state imaging device according to the present embodiment. In FIG. 12A, a solid state imaging device 100 according to a comparative example is schematically illustrated. In FIG. 12B, the solid state imaging device 1 of the present embodiment is schematically illustrated.

As illustrated in FIG. 12A, the solid state imaging device 100 includes a transfer section 17 instead of the transfer section 7 of the present embodiment, and includes a shift register 19 instead of the shift register 9 of the present embodiment. The transfer section 17 has a length in the second direction D2 that gradually increases in the horizontal transfer direction TD1 in the entire transfer section 17. The transfer section 17 is positioned between the pixel region 3a and the shift register 9 in the second direction D2. In the entire region of the transfer section 17 in the first direction D1, an interval between the pixel region 3a and the shift register 19 gradually increases in the horizontal transfer direction TD1. Therefore, a charge transfer distance along the second direction D2 from the pixel region 3a to the shift register 9 becomes long.

The entire shift register 19 extends along a direction intersecting the first direction D1 and the second direction D2. In this case, a charge that tries to move in the horizontal transfer direction TD1 is transferred while hitting a boundary with the transfer section 17 in the shift register 19. Therefore, charge transfer efficiency in the shift register 9 may deteriorate due to inhibition by a potential of the transfer section 17.

In contrast, in the solid state imaging device 1 of the present embodiment, the transfer section 7 includes the first region 13 including the plurality of first transfer column regions 13A and the second region 14 including the plurality of second transfer column regions 14A. In each of the first transfer column regions 13A, the charge transfer distance along the second direction D2 is short as compared with each of the second transfer column regions 14A. Therefore, the charge transfer distance along the second direction D2 is short in the solid state imaging device 1 as compared with the comparative example in which the length in the second direction D2 of all the transfer column regions 7a included in the transfer section 7 gradually increases in the horizontal transfer direction TD1.

The shift register 9 includes the third region 15 and the fourth region 16. In the third region 15, a charge that tries to move in the horizontal transfer direction TD1 tends not to hit the boundary with the transfer section 7 in the shift register 9. Therefore, the charge transfer in the shift register 9 tends not to be inhibited by the potential of the transfer section 7.

The solid state imaging device 1 improves the charge transfer efficiency in the shift register 9 as compared with the comparative example in which the entire shift register 9 extends along the direction intersecting the first direction D1 and the second direction D2.

As described above, the solid state imaging device 1 improves the charge transfer efficiency.

In the present embodiment, each long side of the fourth region 16 extends linearly to intersect the first direction D1 and second direction D2 at the predetermined angle. In this configuration, the charge transfer in the shift register 9 tends not to be inhibited by the potential of the transfer section 7 even in a case in which the charge hits the boundary with the transfer section 7 in the shift register 9 in the fourth region 16, for example, as compared with a configuration in which each long side of the fourth region 16 is bent in a staircase shape.

The fourth region 16 is inclined at the gentle angle closer to the first direction D1 than to the second direction D2. In this configuration, the charge transfer in the shift register 9 tends not to be inhibited by the potential of the transfer section 7 even in a case in which the charge hits the boundary with the transfer section 7 in the shift register 9 in the fourth region 16, for example, as compared with a configuration in which the fourth region 16 is inclined at an angle larger than 45° with respect to the first direction D1.

Consequently, the solid state imaging device 1 controls deterioration in charge transfer efficiency even in a case in which the charge hits the boundary with the shift register 9 in the transfer section 7.

In the present embodiment, each of the second transfer column regions 14A includes the first impurity region 11 and the second impurity region 12. Since the width W of the second impurity region 12 in the first direction D1 increases in the vertical transfer direction TD2, the electrical potential gradient in which the electrical potential increases in the vertical transfer direction TD2 is formed in each of the second transfer column regions 14A. Therefore, each of the second transfer column regions 14A having a long charge transfer distance from the pixel region 3a to the shift register 9 also efficiently transfers the charge due to this electrical potential gradient.

In the present embodiment, the widths $W_1, \ldots, W_k, \ldots,$ and $W_n$ of the second impurity region 12 in the respective sections $L_1, \ldots, L_k, \ldots,$ and $L_n$ are set such that the electrical potential difference of the second impurity region 12 between the adjacent sections among the sections $L_1, \ldots, L_k, \ldots,$ and $L_n$ is constant. In the solid state imaging device 1, the electrical potential gradient in the second transfer column region 14A is approximately constant. Therefore, the second transfer column region 14A transfers the charge more efficiently.

Even in a case in which the width of the shift register 9 in the first direction D1 is not smaller than the width of the pixel region 3a in the first direction D1, the solid state imaging device 1 ensures the region S surrounded by the corresponding shift register 9 and the shift register 9 adjacent to the corresponding shift register 9 in the horizontal transfer direction TD1. In this region S, the amplifier AM that is arranged to output the signal corresponding to the charge acquired from the corresponding shift register 9 is disposed. Therefore, the charge transfer direction tends not to be bent from the shift register 9 toward the amplifier AM in the solid state imaging device 1. The configuration in which the amplifier AM is disposed in the region S improves the charge transfer efficiency and facilitates the design of the solid state imaging device 1.

Although the embodiment of the present invention has been described as above, the present invention is not necessarily limited to the above-described embodiment, and various modifications can be made in a range without departing from a gist thereof.

For example, the shape of the second impurity region 12 is not limited to the shape illustrated in the above embodiment. The second impurity region 12 can have various shapes as illustrated in FIG. 13A to 13E. FIG. 13A to 13E are schematic views illustrating modifications of the second impurity region. In FIG. 13A to 13E, a boundary position of each of sections obtained by dividing the second transfer column region 14A into a plurality of sections is indicated by a two-dot chain line.

Figure 13A:
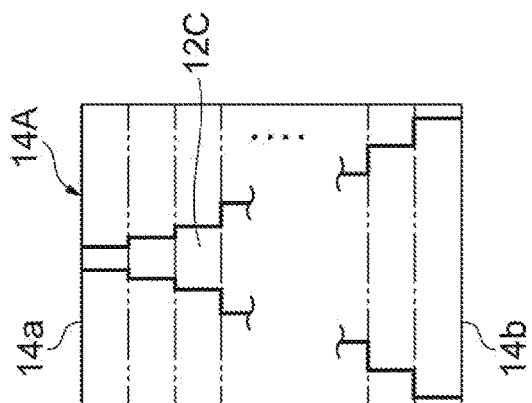
FIG. 13A to 13E are schematic views illustrating modifications of the second impurity region.

In the above embodiment, the second impurity region 12 is provided from the short side 14a to the short side 14b in the second transfer column region 14A. The second impurity region 12 is not necessarily provided from the short side 14a in the second transfer column region 14A. For example, as illustrated in FIG. 13A, the second impurity region 12A is provided from a vicinity of the short side 14a to the short side 14b. The vicinity of the short side 14a means, for example, a position away from the short side 14a to such an extent that movement of a charge is not hindered. In this case, the vicinity of the short side 14a is a position separated by about several μm from the short side 14a. In FIG. 13A, the vicinity of the short side 14a is a position closer to the short side 14b than the short side 14a in the section $L_1$, which is the closest to the short side 14a among the sections $L_1, \ldots, L_k, \ldots,$ and $L_n$.

Figure 13B:
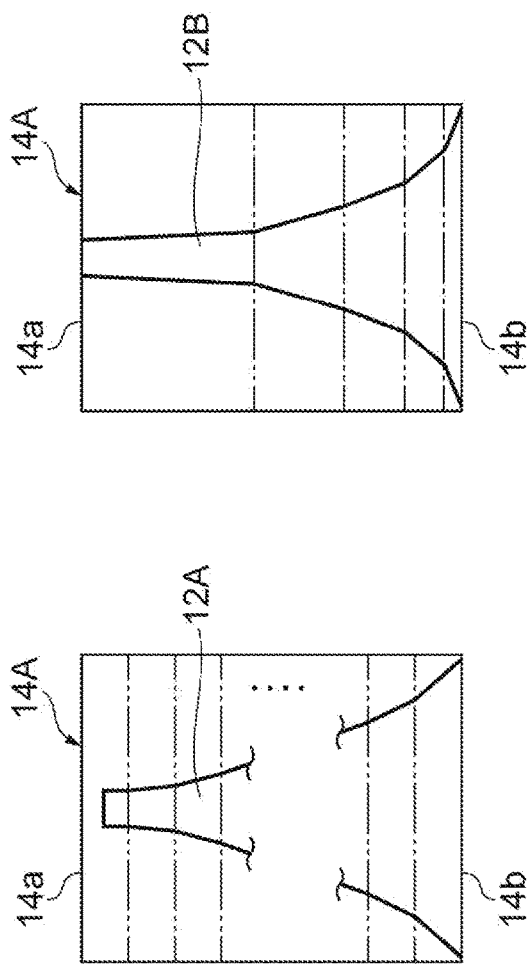

In the above embodiment, each of the sections $L_1, \ldots, L_k, \ldots,$ and $L_n$ is each of the sections obtained by equally dividing the second transfer column region 14A into n sections, and the widths of the respective sections $L_1, \ldots, L_k, \ldots,$ and $L_n$ in the second direction D2 are equivalent. The widths of the respective sections $L_1, \ldots, L_k, \ldots,$ and $L_n$ in the second direction D2 are not necessarily equivalent. As illustrated in FIG. 13B, each of the sections is, for example, each of sections obtained by dividing the second transfer column region 14A such that a width in the second direction D2 becomes gradually narrower in the vertical transfer direction TD2. Even in this case, an increase rate of a width of a second impurity region 12B in each of the sections becomes gradually larger in the transfer direction TD.

Figure 13C:
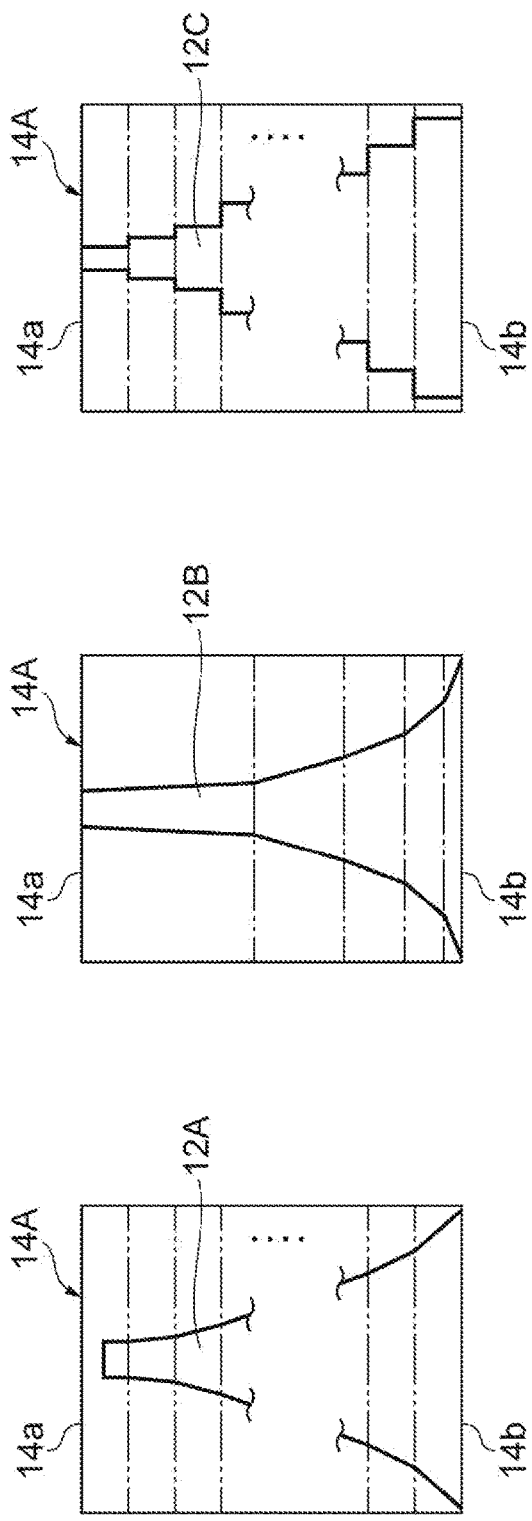

In the above embodiment, the width W of the second impurity region 12 increases within each of the sections $L_1, \ldots, L_k, \ldots,$ and $L_n$. The width W of the second impurity region 12 does not necessarily increase within each of the sections $L_1, \ldots, L_k, \ldots,$ and $L_n$. For example, as illustrated in FIG. 13C, a width W of a second impurity region 12C does not increase within each section, but increases at a boundary position of each of the sections. An outer shape of the second impurity region 12C within each of the sections is a rectangle.

Figure 13D:
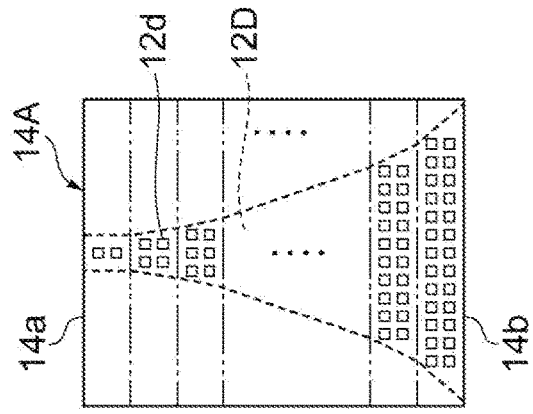
Figure 13E:
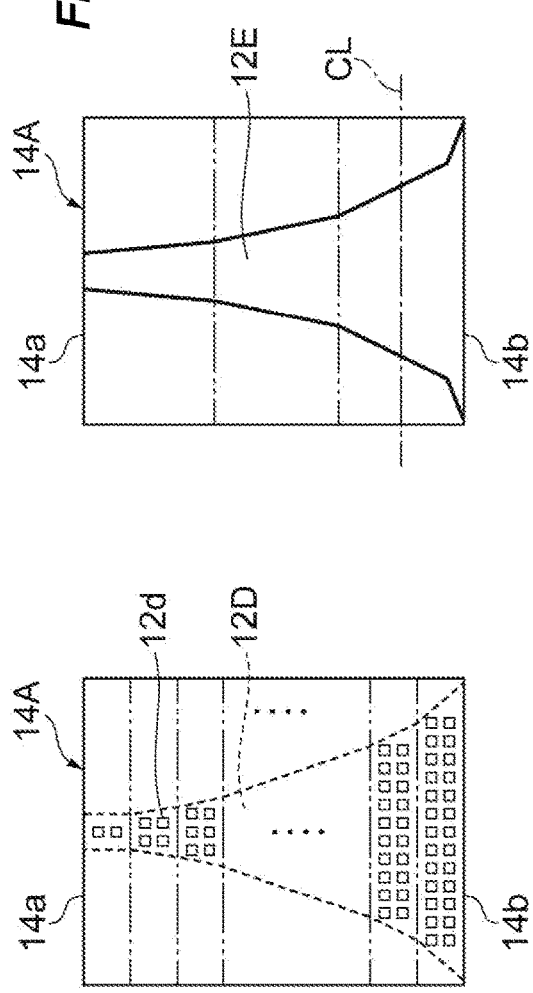

In the above embodiment, the second impurity region 12 is constituted by one region. The second impurity region 12 may be constituted by a plurality of minute regions. For example, as illustrated in FIG. 13D, the second impurity region 12D is constituted by a plurality of minute regions 12d in each section. In FIG. 13D, an outline of a region corresponding to the second impurity region 12D is indicated by a broken line.

In the section $L_n$, which is the closest to the short side 14b among the sections $L_1, \ldots, L_k, \ldots,$ and $L_n$, an increase rate of the width $W_n$ of the second impurity region 12 may change so as to increase near the short side 14b. For example, in FIG. 13E, the second transfer column region 14A is equally divided into three sections.

In a section which is the closest to the short side 14b among sections obtained by equally dividing the second transfer column region 14A into three sections, an increase rate of a width of the second impurity region 12E is not constant but changes so as to become larger near the short side 14b. The second transfer column region 14A may be equally divided into two sections or may be equally divided into four or more sections. The expression, "near the short side 14b" means, for example, to be closer to the short side 14b than the center line CL in the second direction D2 in the section that is the closest to the short side 14b.

The second transfer column regions 14A does not necessarily include a plurality of impurity regions having different impurity concentrations. The second transfer column region 14A does not necessarily include the second impurity region 12.

INDUSTRIAL APPLICABILITY

The present invention can be used for a multi-port CCD image sensor.

REFERENCE SIGNS LIST 1 solid state imaging device
3a pixel region
6 photosensitive region
7 transfer section
9 shift register
11 first impurity region
12 second impurity region
13 first region
13A first transfer column region
14 second region
14A second transfer column region
14a short side
14b short side
15 third region
16 fourth region
AM amplifier
D1 first direction
D2 second direction
TD1 horizontal transfer direction
TD2 vertical transfer direction
H interval
La, Lb length
S region
W width

The invention claimed is:

1. A solid state imaging device comprising:
a plurality of pixel regions each including a plurality of photosensitive regions two-dimensionally arrayed in a first direction and a second direction orthogonal to the first direction, the plurality of pixel regions being distributed in the first direction;
a plurality of first transfer sections each distributed with a corresponding pixel region of the plurality of pixel regions in the second direction and arranged to transfer a charge generated in the photosensitive region for each of the corresponding pixel regions; and
a plurality of second transfer sections each distributed with a corresponding first transfer section of the plurality of first transfer sections in the second direction, arranged to acquire the charge transferred from the corresponding first transfer section, and arranged to transfer the acquired charge in the first direction,
wherein each of the first transfer sections includes
a first region including a plurality of first transfer column regions distributed in the first direction, and
a second region including a plurality of second transfer column regions distributed in the first direction, and positioned downstream of the first region in a charge transfer direction in the second transfer section,
lengths in the second direction of the plurality of first transfer column regions are equal,
lengths in the second direction of the plurality of second transfer column region are longer than the length of the first transfer column region, and increase as the second transfer column region is positioned downstream in the charge transfer direction, and
each of the second transfer sections includes
a third region disposed to correspond to the first region and extending along the first direction, and
a fourth region disposed to correspond to the second region and extending along a direction intersecting the first direction and the second direction such that an interval between the fourth region and the pixel region in the second direction increases in the charge transfer direction in response to a change in the lengths of the plurality of second transfer column regions, and
each of the plurality of first transfer sections is arranged to transfer the charge along the second direction to a corresponding second transfer section of the plurality of second transfer sections.

2. The solid state imaging device according to claim 1, wherein
each of the second transfer column regions includes a first impurity region and a second impurity region having a higher impurity concentration than that of the first impurity region,
the second impurity region is provided in each of the second transfer column regions from one end positioned closer to the pixel region in the second direction or from a vicinity of the one end to another end closer to the second transfer section, and
a width of the second impurity region in the first direction increases in a vertical transfer direction from the one end to the other end.

3. The solid state imaging device according to claim 2, wherein
the width of the second impurity region in each section, obtained by dividing the second transfer column region into n sections in the second direction, is set such that an electrical potential difference of the second impurity region between adjacent sections is constant, n being an integer of two or more.

4. The solid state imaging device according to claim 1, further comprising
a plurality of output sections arranged to acquire the charge from a rear end in the charge transfer direction of a corresponding second transfer section of the plurality of second transfer sections, and to output a signal corresponding to the acquired charge,
wherein the output section is disposed in a region surrounded by the corresponding second transfer section and the second transfer section adjacent to the corresponding second transfer section in the charge transfer direction.

5. The solid state imaging device according to claim 1, wherein
each of the plurality of first transfer sections is arranged not to transfer the charge in the first direction.

6. The solid state imaging device according to claim 1, wherein
the first region and the second region are adjacent to a corresponding pixel region of the plurality of pixel regions in the second direction.

* * * * *